United States Patent [19]
Fu

[11] Patent Number: 5,760,634
[45] Date of Patent: Jun. 2, 1998

[54] HIGH SPEED, LOW NOISE OUTPUT BUFFER

[75] Inventor: Shiu-Jin Fu, Chun-Li, Taiwan

[73] Assignee: United Microelectronics Corporation, Hsinchu, Taiwan

[21] Appl. No.: 710,184

[22] Filed: Sep. 12, 1996

[51] Int. Cl.⁶ .............. H03K 19/0944; H03K 19/0185; H03K 17/16
[52] U.S. Cl. .............. 327/391; 327/374; 327/185; 327/112; 326/27
[58] Field of Search .............. 326/27, 56, 57, 326/58; 327/111, 112, 185, 374, 376, 377, 379, 389, 391

[56] References Cited

U.S. PATENT DOCUMENTS

| | | | |
|---|---|---|---|
| 5,057,711 | 10/1991 | Lee et al. | 326/27 |
| 5,122,690 | 6/1992 | Bianchi | 326/27 |
| 5,153,457 | 10/1992 | Martin et al. | 326/27 |
| 5,406,139 | 4/1995 | Sharpe-Geisler | 326/71 |
| 5,519,338 | 5/1996 | Campbell et al. | 326/27 |
| 5,537,060 | 7/1996 | Baek | 326/27 |
| 5,583,455 | 12/1996 | Kobayashi et al. | 326/84 |

OTHER PUBLICATIONS

Wada et al., "Simple Noise Model and Low-Noise Data-Output Buffer for Ultra High-Speed Memories," IEEE Journal of Solid-State Circuits, vol. 25, No. 6, Dec. 1990, pp. 1586–1588.

*Primary Examiner*—Margaret Rose Wambach
*Assistant Examiner*—Terry L. Englund
*Attorney, Agent, or Firm*—Barnes, Kisselle, Raisch, Choate, Whittemore & Hulbert, P.C.

[57] ABSTRACT

An output buffer device utilizes a PMOS transistor as a first pull-up element and an NMOS transistor as a second pull-up element. An output signal is used to control a feedback circuit. An output signal is switched from a low to high voltage by a trigger voltage. The first pull-up element switches to the second pull-up element to complete the voltage switching from low to high. The device combines the high speed of the first pull-up element and the low noise of the second pull-up element.

13 Claims, 2 Drawing Sheets

HIGH SPEED, LOW NOISE OUTPUT BUFFER

FIELD OF THE INVENTION

The present invention generally relates to an interface circuit for an integrated circuit chip and more particularly, relates to an output buffer device having a short switching time and a low switching noise.

BACKGROUND OF THE INVENTION

Output buffers have been used in semiconductor type integrated circuits. In output buffer applications, two primary requirements should generally be met. One requirement is that the buffer circuit should have a fast response speed. The other requirement is that when the circuit is operating at such fast response speed, the noise produced should not affect the operation of the circuit.

Referring initially to FIG. 1, the circuit of a conventional output buffer 10 is shown. An input signal DATA which is to be buffered is fed into an input terminal 12. A control signal CTL is fed into another input terminal 14 in the circuit to determine whether the output from the output buffer 10 is a buffered input signal DATA, i.e., whether the output is in a high impedance floating tri-state after a shut-down. The output signal O/P is outputted from an output terminal 16.

The input signals CTL and DATA are fed simultaneously into two input terminals of both the NAND gate 18 and the NAND gate 20. The input signal DATA fed into the NAND gate 20 is first inverted by the inverter 22. An output from the NAND gate 18 is presented to a node 28 through inverters 24 and 26 in the circuit diagram of FIG. 1. The output from the NAND gate 20 is presented to a node 32 through an inverter 30. A PMOS transistor MP1 has a gate connected to the node 28. The PMOS transistor MP1 also has a drain connected to the output terminal 16 and a source connected to the voltage $V_{DD}$. The PMOS transistor MP1 is used as a pull-up element. An NMOS transistor MN1 has a gate connected to node 32, a drain connected to the output terminal 16 and a source connected to ground. The NMOS transistor MN1 is used as the pull-down element. A capacitor C1, used as the load impedance for the next stage circuit (not shown), is connected between the output terminal 16 and ground GND. The PMOS transistor MP1 and the NMOS transistor MN1 may utilize alternate topologies to meet the design criteria of a particular application.

In the output buffer 10 shown in FIG. 1, when the input signal CTL is a logic "0", a logic "1" status is present at node 28 and a logic "0" status is present at node 32. At this time, the transistors MP1 and MN1 are both in a closed status and as such, a high impedance tri-state is present at the output terminal 16. To the contrary, if the input signal CTL has a logic "1" status, the status of the output signal O/P changes according to the logic status of the input signal DATA. Therefore, the input signal CTL can be viewed as an enable signal for the output buffer 10.

When the output buffer 10 is enabled, i.e., when the input signal CTL is driven to a logic "1" status and the input signal data is at a logic "1" status, then a logic "0" status at node 28 is present through NAND gate 18, inverter 24 and inverter 26. The logic "0" status at node 32 is present through the route of inverter 22, NAND gate 20 and inverter 30. When the pull-up transistor MP1 is in an open state and the pull-down transistor MN1 is in a closed state, then the output signal O/P, switches from a low potential state to a high potential state (i.e., a status change from logic "0" to "1"). Since the pull-up transistor MP1 is preferably a PMOS transistor, the voltage status of logic "1" can reach the source voltage status $V_{DD}$. To the contrary, if the input signal DATA is a logic "0" status, then through the NAND gate 18 and the inverters 24 and 26 present a logic "1" status at node 28. Additionally, inverter 22, NAND gate 20 and inverter 30, present a logic "1" status at node 32. Under such conditions, the pull-up transistor MP1 is in a closed state while the pull-down transistor MN1 is in an open state. Then the output signal O/P switches from a high voltage state to a low voltage state (i.e., from a logic "1" status to a logic "0" status). Specifically, the status change at the output terminal 16 is from $V_{DD}$ to the ground GND. The solid line 100 shown in FIG. 4 is a plot of the output voltage versus time.

The low to high voltage status change at the output terminal 16 is achieved by utilizing the opening of PMOS transistor MP1 to the voltage position of the source voltage $V_{DD}$. When later the NMOS transistor MN1 turns on and the PMOS transistor MP1 turns off a transition from high to low occurs at the output terminal 16. The variation in the current combines the parasitic inductance between the transistors MN1 and the ground GND and produces noise. Thus the logic (voltage) position may be confused. In a paper published by Wada et al, "Simple Noise Model and Low-Noise Data—Output Buffer For Ultra High-Speed Memories", IEEE Journal of Solid-State Circuits, 25(6), December 1990, pp. 1586–1588, a simplified relationship for the switching speed and noise can be expressed as:

$$V_{nmax} = \frac{1}{1+(T_r/L \cdot G_0)} V_{dout}$$

Wherein $V_{NMAX}$ is the peak voltage of the noise, Tr is the switching time, $G_0$ is the electrical conductivity of the output metal oxide semiconductor, $V_{dout}$ is the voltage difference between the high and low voltage at the output terminal, and L is the parasitic inductance at ground.

From the above relationship, it is shown that by reducing the voltage difference between the high and low voltage at the output terminal, the noise level can be reduced. Consequently, others have proposed an output buffer by using an NMOS transistor as the pull-up element. This is shown in FIG. 2. The circuit diagram of a conventional output buffer 40 is shown wherein an input signal DATA to be buffered is fed into the input terminal 42. Another control signal CTL which is fed into the input terminal 44 is used to determine whether the output signal O/P from output buffer 40 is a buffered input signal DATA or whether the output is a closed high impedance floating status. The output signal O/P is presented at the output terminal 46.

The input signals CTL and DATA are simultaneously connected to both the NAND gate 48 and the NAND gate 50. The input signal DATA, received by NAND gate 50, is first inverted by an inverter 52. The output from the NAND gate 48 first is inverted by the inverter 54 and is then presented at node 56. The output from NAND gate 50 is inverted through an inverter 58 and presented at node 60. An NMOS transistor MN3 has a gate connected to node 56, a source connected to the output terminal 46 and a drain connected to source voltage $V_{DD}$. The transistor MN3 is used as a pull-up element. An NMOS transistor MN2 has a gate connected to the node 60, a drain connected to output terminal 46 and a source connected to ground GND. The transistor MN2 is used as a pull-down element. Furthermore, a capacitor C2 is used as the load impedance for the next stage circuit (not shown) and connected between output terminal 46 and ground GND.

In the output buffer 40 shown in FIG. 2, if the input signal CTL is a logic "0", then a logic "0" voltage would be present at node 56 and a logic "0" voltage would be present at node 60. At this time, the transistors MN2 and MN3 are both closed such that a high impedance floating tri-state is present at output terminal 46. To the contrary, if the input signal CTL has a logic "1" voltage status, then the output signal O/P at the output terminal 46 changes according to the logic voltage position of the input signal DATA. Consequently, the input signal CTL can be viewed as the enable signal for the output buffer 40.

When the output buffer 40 is enabled, (i.e. when the input signal CTL is driven to a logic "1" status), the NAND gate 48 and inverter 54 present a logic "1" status at node 56. A logic "0" status is present at node 60 through a route of the inverter 52, the NAND gate 50 and the inverter 58. If the pull-up element MN3 is in an open state and the pull-down element MN2 is in a closed state, then the output signal O/P presents a low to high voltage switching (i.e. a status switching from a logic "0" to "1"). Since the pull-up element MN3 of the buffer 40 utilizes an NMOS transistor, the voltage position for logic "1" is the source voltage $V_{DD}$ minus a threshold voltage $V_{TN3}$. Therefore, the NMOS transistor MN3 has a body effect and its value is higher than the transistor MN2. On the other hand, if the input signal DATA is at a logic "0" position, then a logic "0" status is present at node 56 through the NAND gate 48 and the inverter 54. A logic "1" position is presented at node 60 through the inverter 52, the NAND gate 50 and the inverter 58. The pull-up element MN3 is in a closed state and the pull-down element MN2 is in an open state. The output signal O/P at the output terminal 28 presents a high to low voltage switching or a logic "1" to "0" status switching such that a $V_{DD}-V_{TN3}$ position is switched to the ground GND position at the output terminal 46. The dashed line 104 in FIG. 4 represents the change of output voltage of the output buffer 40 according to time.

From the above relationship between the switching speed and the noise, the peak voltage of the noise can be reduced by reducing the voltage difference $V_{dout}$ between the high and low position at the output terminal 46. When an NMOS transistor MN3 is used as the pull-up element, its drive current is smaller than when a PMOS transistor is used. As shown in FIG. 4, when the output voltage is switched from low to high, when compared to a PMOS transistor, the curve indicates a gradual trend of increase indicating a longer rise time. The use of a single NMOS transistor is therefore not suitable for applications where higher speed is desired.

It is therefore an object of the present invention to provide an output buffer device that has the advantages of high speed and low noise.

SUMMARY OF THE INVENTION

In the preferred embodiment, an output buffer device is provided by utilizing a PMOS transistor as a first pull-up element and an NMOS transistor as its second pull-up element. An output signal is used to control a feedback circuit. When the output signal is switched from a low voltage to a high voltage at a trigger voltage, the first pull-up element switches to the second pull-up element to complete the voltage switching from low to high. The preferred embodiment presents the advantages of high speed of the first pull-up element and the low noise of the second pull-up element.

The present invention also provides an output buffer device which produces an output signal based on a first control signal and a second control signal. The buffer device includes a pull-down device coupled to the output terminal to produce a high to low voltage switching of the output signal based on the first control signal. A first pull-up device is preferably coupled to the output terminal to produce a low to high voltage switching of the output signal based on the second control signal. A second pull-up device is preferably coupled to the output terminal. A feedback circuit is coupled to the first and the second pull-up devices to switch between the first pull-up device and the second pull-up device based on the output signal, completing the low to high voltage switching.

BRIEF DESCRIPTION OF THE DRAWINGS

The objects, features and advantages of the present invention will be apparent from the following detailed description and the appended drawings in which.

DETAILED DESCRIPTION OF THE PREFERRED EMBODIMENTS

Figure 3:
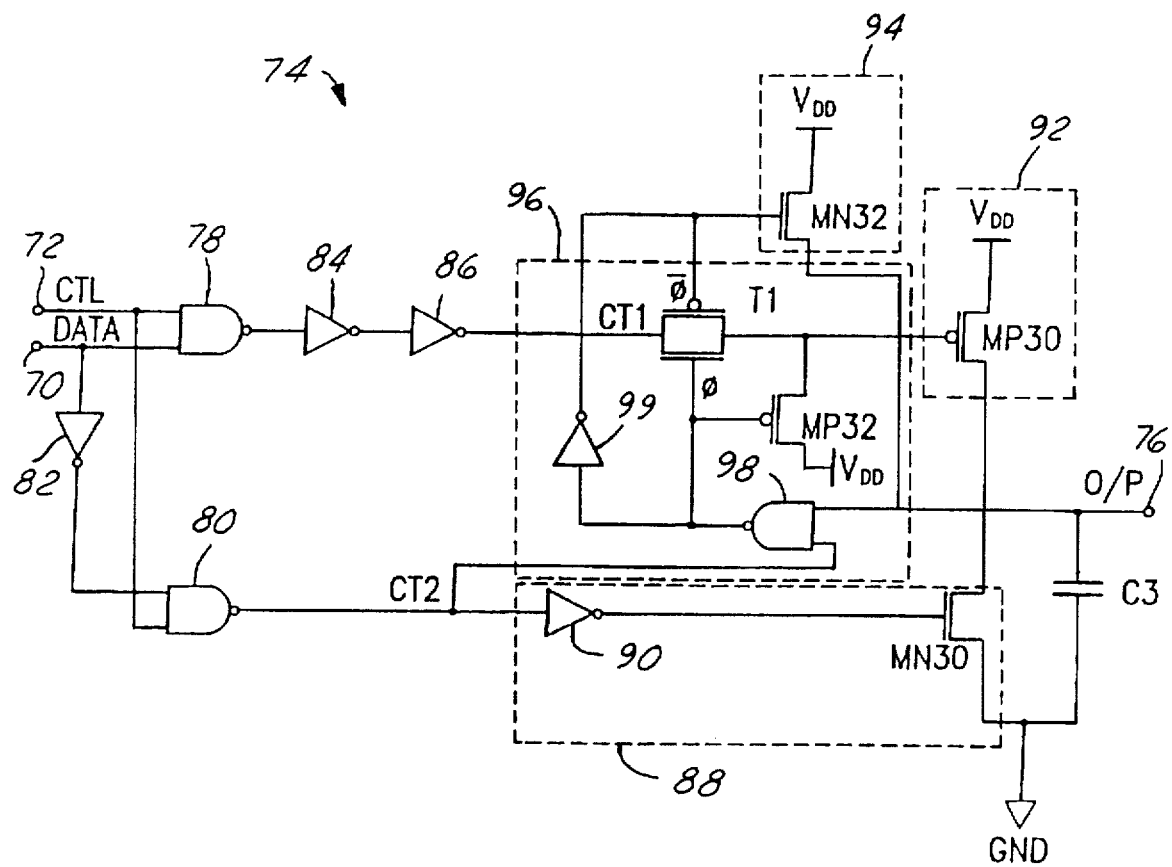
FIG. 3 is a circuit diagram of the preferred embodiment of the present invention.

Referring now to FIG. 3, a circuit diagram of the output buffer 74 of the preferred embodiment of the present invention is shown. An input signal DATA that is to be buffered is present at the input terminal 70. A control signal CTL present at another input terminal 72 is used to determine whether the output from the output buffer 74 is the buffered input signal DATA or a shut-off output high impedance floating tri-state. An output signal O/P is outputted from the output terminal 76.

The input signals CTL and DATA are presented simultaneously to both the NAND gate 78 and the NAND gate 80. The input signal DATA received by the NAND gate 80 must first be inverted by an inverter 82. The output from NAND gate 78 is inverted by inverters 84 and 86 and presented as a first control signal CT1. A second control signal CT2 is presented from the NAND gate 80.

A pull-down device 88 includes an inverter 90 and an NMOS transistor MN30. The inverter 90 inverts the second control CT2 signal and presents it to the gate of the NMOS transistor MN30. The drain and the source of the transistor MN30 are coupled to the output terminal 76 and the ground GND respectively. A pull-up device 92 comprises, for instance, a PMOS transistor MP30 having a drain and source coupled to the output terminal 76 and the source voltage $V_{DD}$, respectively. A second pull-up device 94 comprises, for instance, an NMOS transistor MN32 having its drain and source coupled to the source voltage $V_{DD}$ and the output terminal 76, respectively. A feedback circuit 96 includes a PMOS transistor MP32, a pass gate T1, a NAND gate 98, and an inverter 99. The pass gate T1 receives a first control signal CT1 and then presents an output to the gate of transistor MP30. The two input terminals of the NAND gate 98 receive the second control signal CT2 and output signal O/P respectively to produce an output signal Ø. A complimentary signal Ø̄ is obtained after being inverted by the inverter 99. Since the pass gate Ti is composed of an NMOS transistor and a PMOS transistor, the signal Ø and Ø̄ are each respectively connected to the gate of the NMOS transistor and the PMOS transistor. Furthermore, the drain and the source of PMOS transistor MP32 are coupled to the output terminal of the pass gate T1 and the source voltage $V_{DD}$, respectively. The gates of the PMOS transistor MP32 and the pull-up element MN32 are each controlled by the signals Ø and Ø̄. The capacitor C3 shown in FIG. 3 is used as the load impedance of the next stage circuit (not shown) and is connected between the output terminal 76 and the ground GND.

In the output buffer 74 shown in FIG. 3, when the input signal CTL is a logic "0", then the first control signal CT1 presents a logic "1" status while the second control signal CT2 also presents a logic "1" status. At this time, the transistors MN30 and MP30 are both in a closed state. As such, a high impedance floating tri-state is present at the output terminal 76. Inversely, if the input signal CTL is a logic "1" status, then the output signal O/P is determined by the logic status of the input signal DATA. Therefore, the input signal CTL can be called the enable signal for the output buffer 74.

Figure 1:
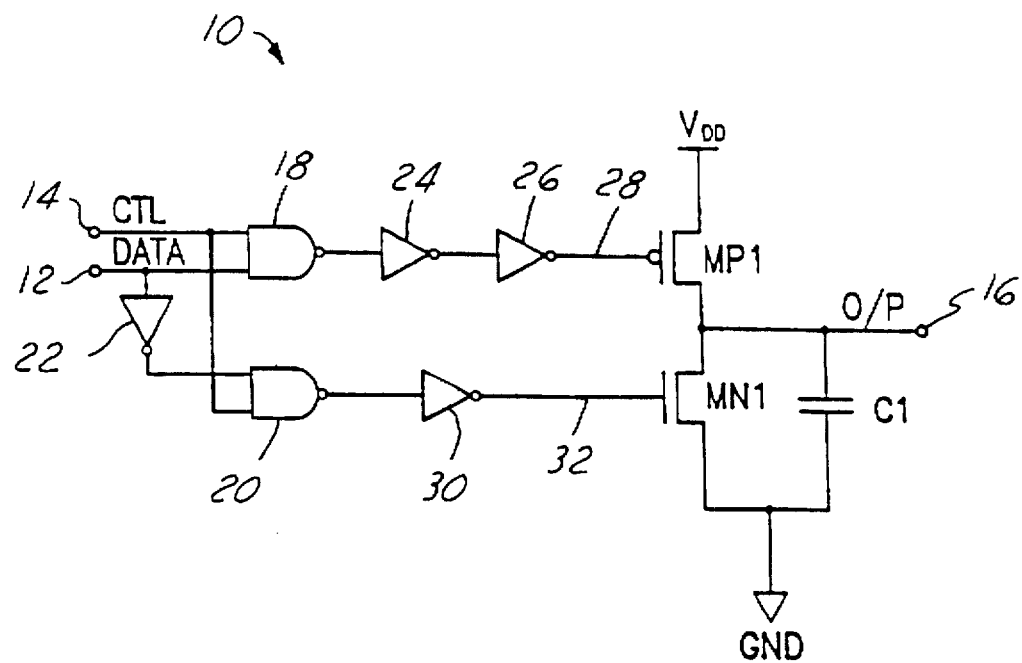
FIG. 1 is a circuit diagram of a conventional output buffer device using a PMOS transistor as the pull-up element.
Figure 2:
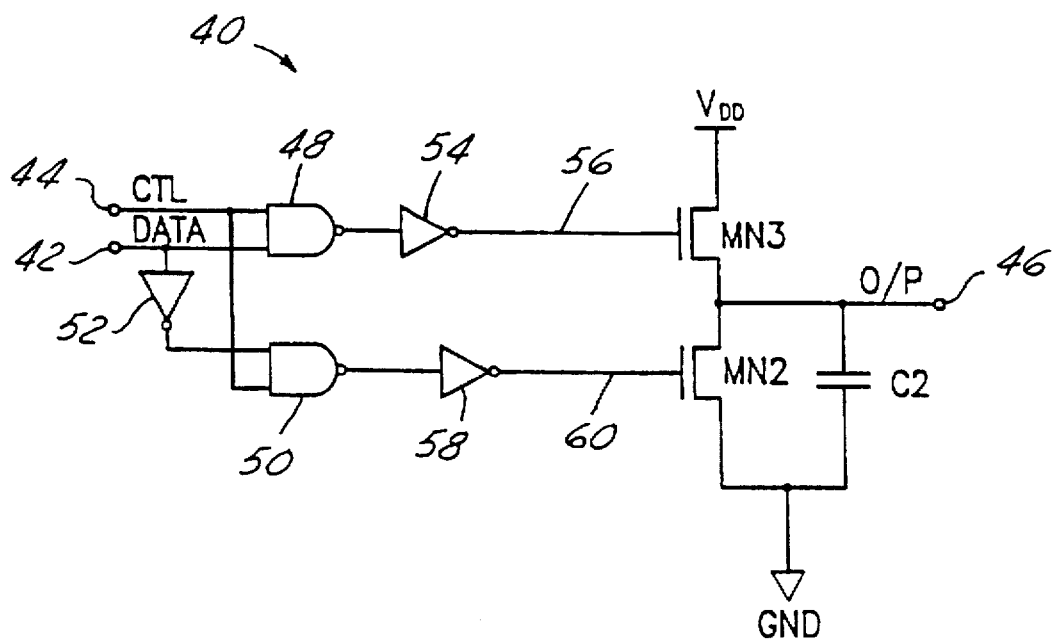
FIG. 2 is a circuit diagram of a conventional output buffer device using an NMOS transistor as the pull-up element.

When the output buffer is enabled (i.e., when the input signal CTL is at a logic "1" status), if the input signal DATA is at a logic "1" status, then the first control signal CT1 through the NAND gate 78, the inverters 84 and 86, is changed to logic "0". Furthermore, through the inverter 82, the NAND gate 80 the second control signal CT2 is changed to a logic "1". The second control signal CT2, after being inverted by the inverter 90, can close the pull-down element MN30. Simultaneously, the second control signal CT2 matches the output signal O/P (at a logic "0" status) to make the signal Ø a logic "1". Through the inverter 99, the complimentary signal Ø̄ is changed into a logic "0". Therefore, the logic status of the first control signal CT1 is present at the gate of the first pull-up element MP30 to make it in an open state. Simultaneously, signals Ø and Ø̄ are present at the gate of the PMOS transistor MP32 and the second pull-up element MN32, respectively, to make them into a closed state. Therefore, the output signal O/P starts to switch from a logic "0" status to a logic "1" status. This low to high voltage switch utilizes the PMOS transistor MP30 as the pull-up element. The rising speed of the PMOS transistor MP30 is therefore similar to the output buffer 10 shown in FIG. 1.

Figure 4:
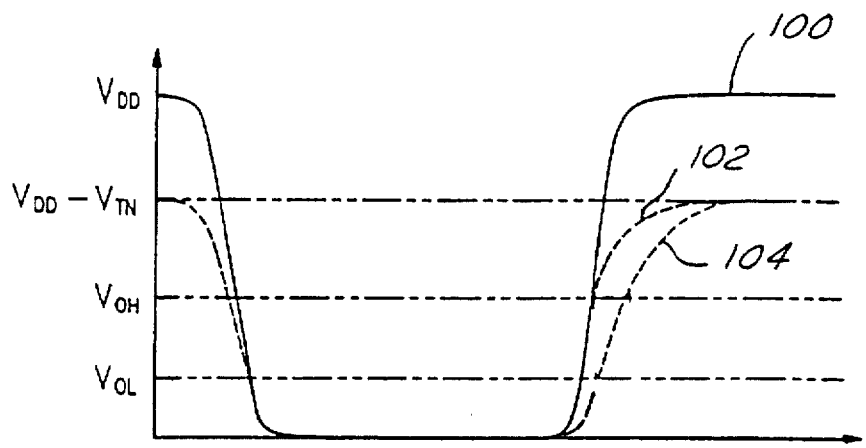
FIG. 4 is a graph illustrating the dependance of output signals on time for the output buffer devices shown in FIGS. 1–3.

When the voltage status of the output signal O/P rises to a trigger position $V_{OH}$ (or when the output terminal for the NAND gate 98 presents a logic "1", the smallest input voltage), the signal Ø is changed to a logic "0" status. It is then inverted by inverter 99 such that the complimentary signal Ø̄ presents a logic "1" status. The pass gate T1 closes and the PMOS transistor MP32 is driven by signal Ø into an open state. The source of the transistor MP32 is coupled to the source voltage $V_{DD}$ and the drain of the transistor MP32 is coupled to the gate of the transistor MP30. The second pull-up element MN32 is driven by signal Ø̄ to charge the output terminal 76. At this time, the pull-up element is the NMOS transistor MN32 and therefore the output signal O/P is only at the $V_{DD}-V_{TN}$ status. $V_{TN}$ is the threshold voltage for the NMOS transistor MN32. When the threshold voltage is higher (approximately 1.5 V), the dependance of the output voltage on time can be shown by curve 102 in FIG. 4.

The present invention output buffer device utilizes an NMOS transistor as the second pull-up device, and, through an output signal, controls a feedback circuit. When the output signal is switched from a low to a high voltage and to a trigger voltage, the first pull-up device switches to the second pull-up device to complete the voltage switching from low to high. The present invention output buffer device therefore possesses the benefit of the high speed of the first pull-up device as well as the benefit of low noise of the second pull-up device.

While the present invention has been described in an illustrative manner, it should be understood that the terminology used is intended to be in a nature of words of description rather than a limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. An output buffer device utilizing a first control signal and a second control signal to produce an output signal at an output terminal, said device comprising:

pull-down means coupled to said output terminal for producing a voltage switching between a high voltage and a low voltage based on said second control signal, first pull-up means coupled to said output terminal to produce a voltage switching from said low voltage to said high voltage based on said first control signal, second pull-up means coupled to said output terminal, and a feedback circuit coupled to said first and said second pull-up means, said feedback circuit makes said second pull-up means turn on and said first pull-up means turn off based on said output signal.

2. A device according to claim 1, wherein said first control signal and said second control signal are in a complementary logic relationship.

3. A device according to claim 2, wherein said pull-down means comprises:

an inverter for receiving and inverting said second control signal; and a transistor having a gate coupled to said inverter, said transistor for receiving said inverted second control signal, said transistor further having a drain coupled to said output terminal and a source coupled to ground.

4. A device according to claim 3, wherein said transistor comprises an NMOS transistor.

5. A device according to claim 2, wherein said first pull-up means comprises a transistor having a drain coupled to said output terminal and a source coupled to a source voltage.

6. A device according to claim 5, wherein said transistor is a PMOS transistor.

7. A device according to claim 5, wherein said second pull-up means comprises a second transistor having a drain coupled to said source voltage and a source coupled to said output terminal.

8. A device according to claim 7, wherein said second transistor is an NMOS transistor.

9. A device according to claim 8, wherein said feedback circuit comprises:

a pass gate having an input terminal for receiving said first control signal and an output terminal connected to the gate of said transistor within the first pull-up means, wherein said first pull-up means transistor is a PMOS transistor, a NAND gate having a first input for receiving said output signal and a second input for receiving said second control signal, said NAND gate generating a first signal present at a first control terminal of said pass gate, an inverter for receiving and inverting said first signal to produce a second signal, said second signal being presented at a second control terminal of said pass gate and at a gate of said NMOS transistor, and a second PMOS transistor having a gate coupled to said first control terminal of said pass gate, a drain coupled to said output terminal of said pass gate and a source coupled to said source voltage.

10. A device according to claim 9, wherein said pass gate comprises another NMOS transistor having a gate T1 as said first control terminal; and another PMOS transistor having a gate T2 as said second control terminal.

11. A device according to claim 9, wherein said output terminal of said device activates said feedback circuit based on a triggering status such that said first pull-up means switches to said second pull-up means to complete the switching from low to high.

12. A device according to claim 9, wherein said output signal has said high voltage obtained by deducting a threshold voltage of said NMOS transistor of said second pull-up means from said source voltage.

13. A device according to claim 1, wherein said first control signal and said second control signal are obtained through an equal number of logic gates.

* * * * *